(12) United States Patent
Tanaka

(10) Patent No.: US 7,767,553 B2
(45) Date of Patent: Aug. 3, 2010

(54) METHOD AND APPARATUS FOR PRINTING CONDUCTIVE INK

(75) Inventor: Yasuo Tanaka, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 987 days.

(21) Appl. No.: 11/243,973

(22) Filed: Oct. 6, 2005

(65) Prior Publication Data

US 2006/0086269 A1    Apr. 27, 2006

(30) Foreign Application Priority Data

Oct. 21, 2004    (JP)    ............... 2004-307334

(51) Int. Cl.
*H01L 21/00* (2006.01)
(52) U.S. Cl. ............ 438/462; 438/15; 438/458; 438/464
(58) Field of Classification Search ........... 438/15, 438/458, 462, 464
See application file for complete search history.

(56) References Cited

U.S. PATENT DOCUMENTS 6,271,563 B1 * 8/2001 Yu et al. ............... 257/344
7,129,109 B2 * 10/2006 Munzer et al. ............ 438/98
2004/0110393 A1 * 6/2004 Munzer et al. ............ 438/778

FOREIGN PATENT DOCUMENTS

JP    2002-307653    10/2002

OTHER PUBLICATIONS

Kosugi Tomoyuki, Translation of JP-2002-307653 cited on IDS filed Oct. 6, 2005, Oct. 23, 2002.*
Kosugi Tomoyuki, Drawings of JP-2002-307653 cited on IDS filed Oct. 6, 2005, Oct. 23, 2002.*

* cited by examiner

*Primary Examiner*—N Drew Richards
*Assistant Examiner*—Joannie A Garcia
(74) *Attorney, Agent, or Firm*—Rabin & Berdo, PC

(57) ABSTRACT

Conductive ink is printed onto a wafer held on a vertically movable stage by using a squeegee to force the conductive ink through a stencil. The stencil is supported from below by a supporting member adjacent to the periphery of the stage. After the conductive ink has been printed through the stencil, pneumatic pressure is applied to the stencil from above, and the stage is lowered to separate the wafer from the stencil. The supporting member holds the stencil taut while the stage is being lowered, so that the stencil does not warp downward and the printed conductive ink leaves the stencil at substantially the same time at all points on the wafer surface, preventing the premature escape of air and loss of pneumatic pressure.

13 Claims, 4 Drawing Sheets

METHOD AND APPARATUS FOR PRINTING CONDUCTIVE INK

BACKGROUND OF THE INVENTION

1. Field of the Invention

The present invention relates to a method of printing a conductive ink such as an ink comprising a solder paste.

2. Description of the Related Art

To meet the increasing demand for smaller, slimmer, and lighter electronic devices, integrated circuits in chip-size packages (CSPs) have become prevalent. When an integrated circuit of this type is mounted on a printed circuit board, it is electrically coupled to the circuit board through conductive bumps such as solder bumps formed as part of the chip-size package. The chip-size package and solder bumps may be formed during the wafer processing stage, when the integrated circuit is still part of a semiconductor wafer that has not yet been diced into individual chips.

Solder bumps can be formed on a semiconductor wafer by screen printing methods similar to the methods used to form solder bumps on printed circuit boards. One known screen printing method, described in Japanese Patent Application Publication No. 2002-307653, for example, uses air pressure to separate the solder bumps from the stencil through which they are printed.

The screen printer employed in this known method has a vertically movable stage on which the circuit board is mounted, and a frame that holds the stencil. The stage is raised to bring the circuit board into contact with the stencil. Solder paste is forced through the stencil onto the circuit board by a squeegee, forming a pattern of solder bumps. A walled cover is then lowered onto the stencil to create an airtight enclosure into which compressed air is introduced through a tube. Next, the stage is lowered to separate the circuit board from the stencil. The elevated air pressure inside the enclosure pushes the solder bumps out from the stencil, allowing the circuit board and printed solder bumps to separate cleanly from the stencil.

When this method is used to print solder bumps on a semiconductor wafer, it has been found that as the stage is lowered, the downward pull caused by friction between the solder paste and the stencil causes the stencil to warp. The peripheral parts of the wafer therefore separate from the stencil before the central part separates. When the peripheral parts of the wafer separate from the stencil, air escapes through the holes near the periphery of the stencil and the air pressure inside the enclosure falls to the ambient level. With air pressure no longer acting on the solder paste printed in the central part of the wafer, there is a tendency for the solder paste to remain stuck in the central part of the stencil, leading to defects such as missing or inadequately formed solder bumps.

SUMMARY OF THE INVENTION

An object of the present invention is to improve the reliability of the printing of solder bumps, or more generally any conductive pattern, on a wafer.

The invention provides a method of printing conductive ink on a wafer disposed on a vertically movable stage, by using a squeegee to force the conductive ink through a stencil extending beyond the periphery of the stage. In the invented method, the stencil is supported from below by a lower member disposed adjacent the periphery of the stage. After the stage has been raised to bring the wafer and stencil into mutual contact and the conductive ink has been printed through the stencil, pneumatic pressure is applied to the stencil and the printed conductive ink while the stencil and the wafer are still in mutual contact; then the stage is lowered to separate the wafer from the stencil. The lower member holds the stencil taut while the stage is being lowered, so that the stencil does not warp downward and the printed conductive ink leaves the stencil at substantially the same time at all points on the wafer surface. The pneumatic pressure is therefore maintained throughout the separation process.

The stencil is preferably also held taut by an upper member, which may include an arrangement for applying the pneumatic pressure. The stencil may be gripped between the upper and lower members. Alternatively, the lower member may be disposed inward of the upper member. In either case, the stencil is held taut by an upward force exerted by the lower member and a downward force exerted by the upper member.

The above printing process may be preceded by the printing of the same conductive ink pattern through a thinner stencil, not necessarily requiring pneumatic pressure for separation, and by reflow of the conductive ink printed through the thinner stencil.

DETAILED DESCRIPTION OF THE INVENTION

Figure 1:
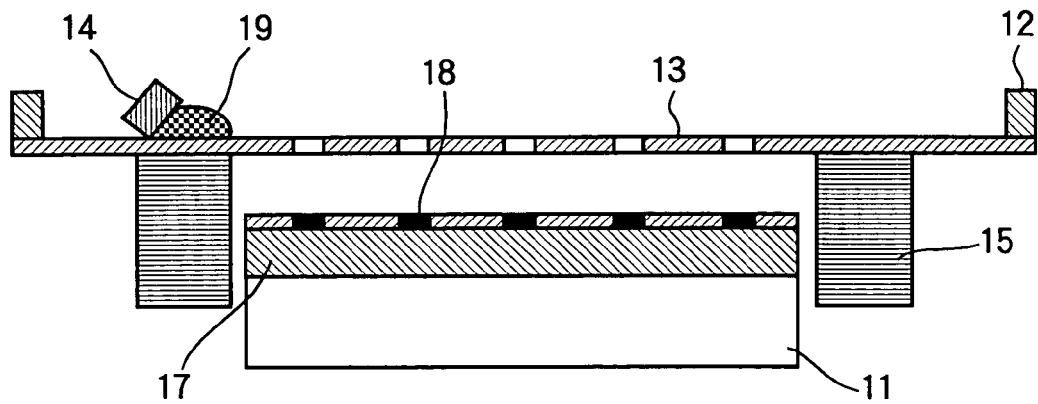
FIGS. 1, 2, 3, and 4 illustrate steps in a first method of printing conductive ink on a wafer according to the present invention.

Embodiments of the invention will now be described with reference to the attached drawings, in which like elements are indicated by like reference characters. The conductive ink referred to in the embodiments includes solder paste, and may include other substances such as flux.

First Embodiment

The first embodiment is a method of printing a conductive ink, illustrated in FIGS. 1 to 4.

Figure 3:
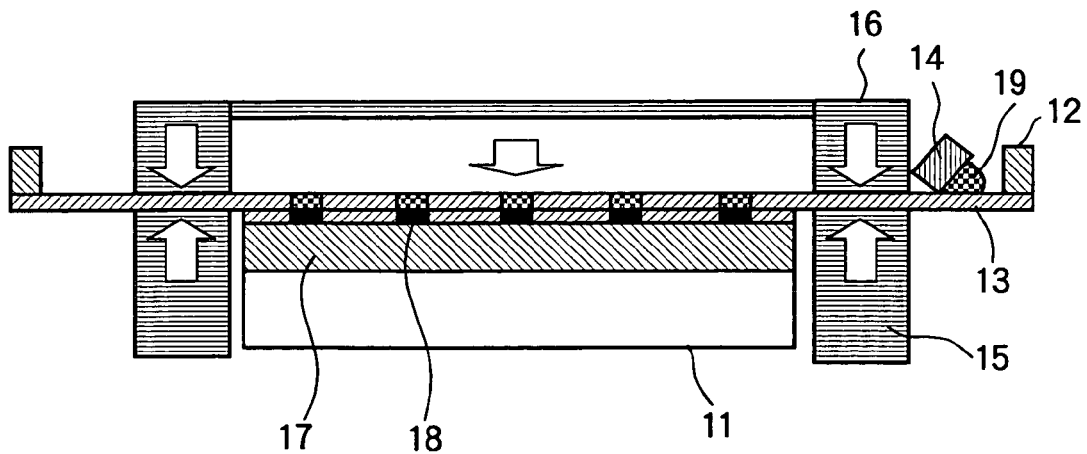
Figure 4:
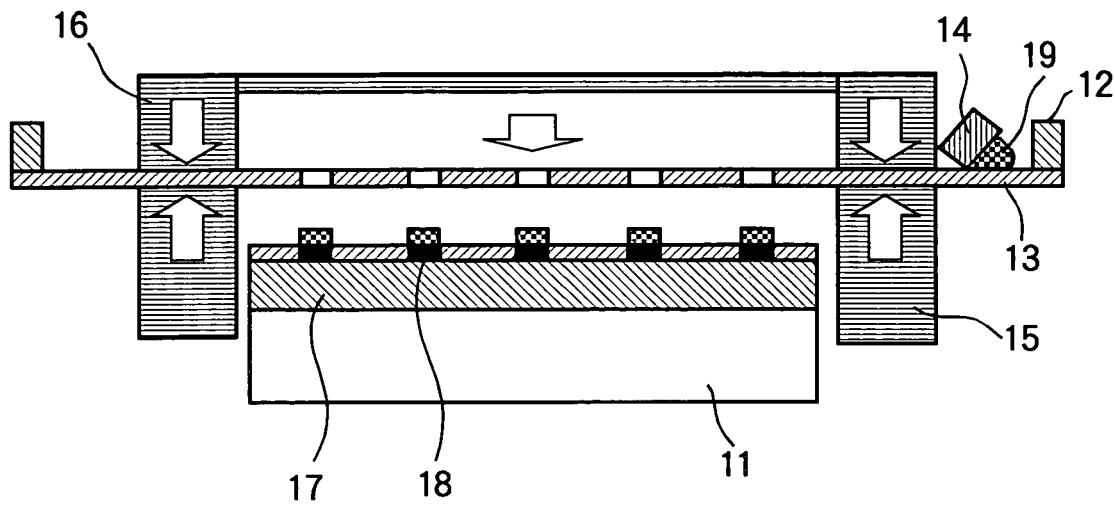

Referring first to FIG. 1, the conductive ink is printed by a printing apparatus having a vertically movable stage 11 and a frame 12 that holds a stencil 13 above the stage 11. The stencil 13 is also supported from below by a lower member 15 disposed around the periphery of the stage 11. A squeegee 14 is mounted above the stencil 13 and is movable horizontally, including both motion to the right and left in the drawings and motion in a back-and-forth direction perpendicular to the drawing sheets, to force conductive ink 19 through openings in the stencil 13. An upper member 16, shown in FIGS. 3 and 4, is mounted above the stencil 13 and squeegee 14, forming an enclosure that is normally open at the bottom. When the upper member 16 is lowered onto the stencil as shown in FIGS. 3 and 4, the upper member 16 and stencil 13 form an enclosed space. The upper member 16 is connected to a tube (not shown) that supplies compressed air to this enclosed space, thereby raising the air pressure in the enclosed space.

Next, the process shown in FIGS. 1 to 4 will be described.

In the step in FIG. 1, a wafer 17 is secured on the stage 11. The wafer 17 and stage 11 preferably have substantially the same horizontal dimensions, as shown.

Figure 2:
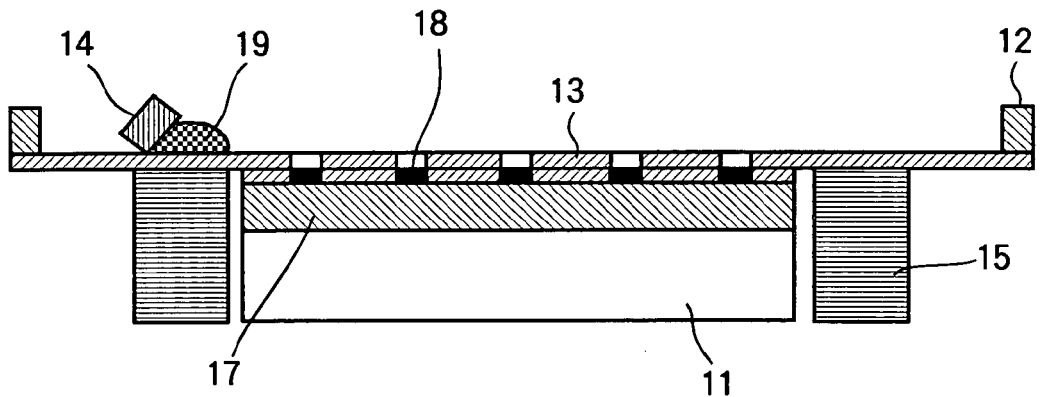

In the step in FIG. 2, the stage 11 is raised together with the wafer 17 to bring the front surface of the wafer 17 and the back surface of the stencil 13 into tight mutual contact, with openings in the stencil 13 aligned on electrode terminals 18 on the wafer 17. It is desirable for the contact to be tight enough to push the stencil 13 slightly upward. Conductive ink 19 is now supplied and the squeegee 14 is moved to print the conductive ink 19 onto the electrode terminals 18 on the wafer 17 through the openings in the stencil 13.

In the step in FIG. 3, after completion of the printing the conductive ink 19, the upper member 16 is lowered onto the stencil 13, which is gripped from above and below between the lower member 15 and upper member 16, as indicated by the arrows. Compressed air is then supplied from a compressed air source (not shown), raising the pressure inside the space enclosed by the upper member 16 and stencil 13 so the pressure in this space exceeds the ambient atmospheric pressure, whereby pneumatic pressure is applied to the conductive ink 19 printed in the openings of the stencil 13.

In the step in FIG. 4, the stage 11 is lowered to separate the wafer 17 from the stencil 13. Being gripped between the lower member 15 and upper member 16, the stencil 13 is held substantially taut and warps only slightly while separating from the wafer 17. The pneumatic pressure in the pressure chamber presses uniformly on the conductive ink 19 so that the conductive ink 19 is pushed smoothly out from the stencil 13, and leaves the stencil 13 at substantially the same time at all points on the wafer surface, maintaining a uniform printed shape on the wafer 17. Pneumatic pressure acts on all of the printed conductive ink 19 throughout the separation process, so that substantially all of the printed conductive ink 19 is forced out of the stencil 13 and substantially none is left behind.

The first embodiment thus prints a uniform pattern of conductive bumps on the electrode terminals 18 on the wafer 17, with no missing or inadequately formed bumps.

Second Embodiment

The second embodiment is another method of printing conductive ink, illustrated in FIGS. 5 to 9. The second embodiment is practiced by using the same conductive ink printing apparatus as in the first embodiment.

Figure 5:
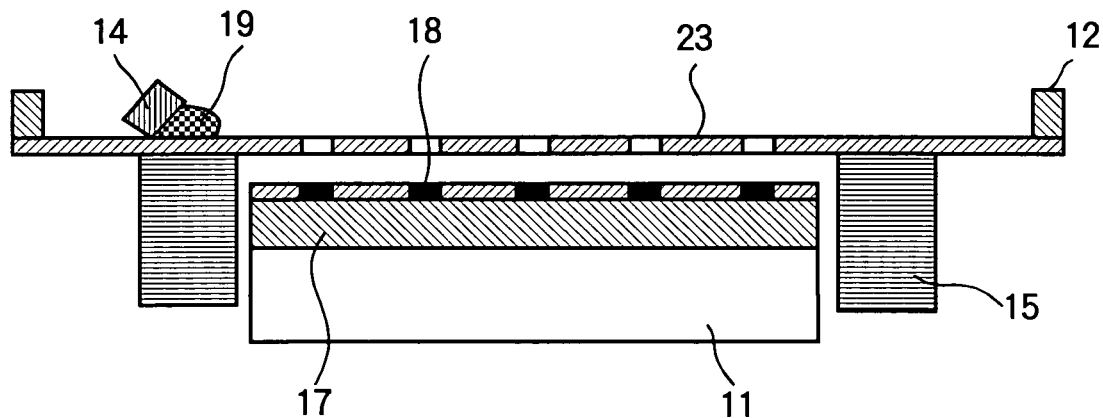
FIGS. 5, 6, 7, 8, and 9 illustrate steps in a second method of printing conductive ink on a wafer according to the present invention.
Figure 6:
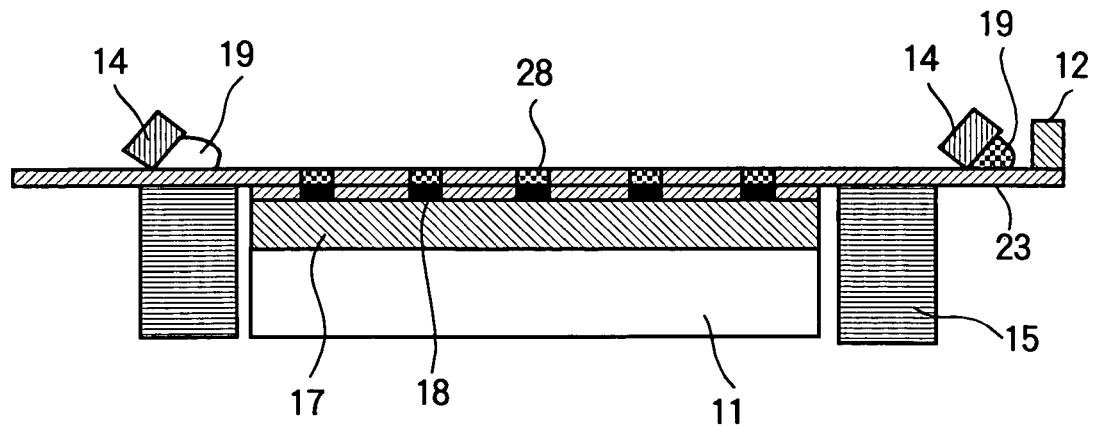

The processes in FIGS. 5 and 6 are similar to the processes in FIGS. 1 and 2 in the first embodiment, except that a thinner stencil 23 is used. Accordingly, less conductive ink 19 is printed, and the electrode terminals 18 are covered with relatively thin layers of conductive ink 28. Detailed descriptions of the processes in FIGS. 5 and 6 will be omitted. The thickness of the stencil 13 is about fifty micrometers (50 μm).

Figure 7:
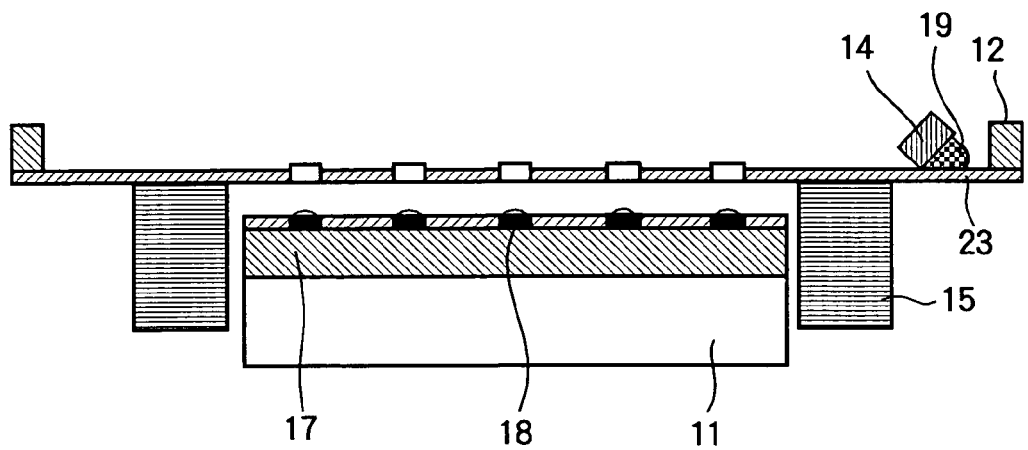

In FIG. 7, a reflow process is performed on the conductive ink 28 printed on the wafer 17, which is temporarily separated from the stencil 23. The reflow process removes oxidized films from the surfaces of the electrode terminals 18, so that better electrical contact and more reliable joints can be formed between the conductive ink 28 and electrode terminals 18.

Figure 8:
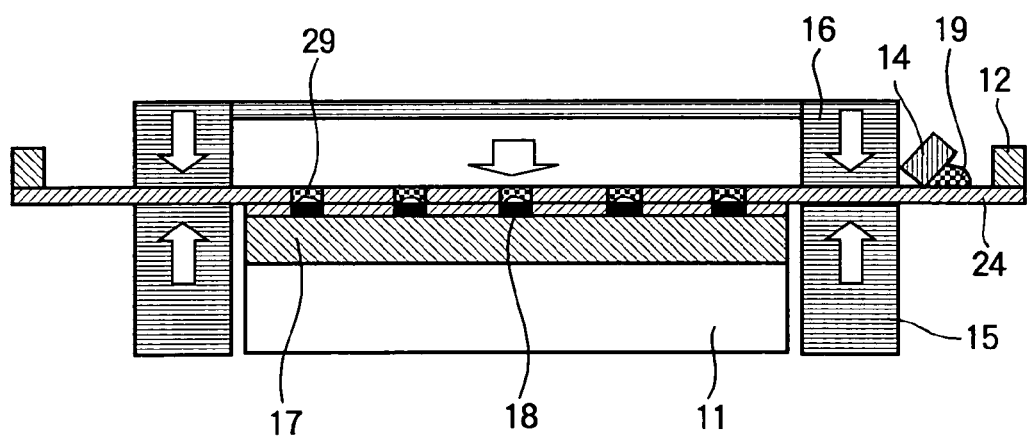

After the reflow process, the stencil 23 is replaced with a thicker stencil 24 having an identical pattern of openings, and the stencil 24 and wafer 17 are aligned again so as to obtain the same alignment of the openings with the printed conductive ink 28; then the squeegee 14 is moved to print more conductive ink 29 in the same locations, as shown in FIG. 8. The thickness of the stencil 23 used in this step is about 300 μm.

Figure 9:
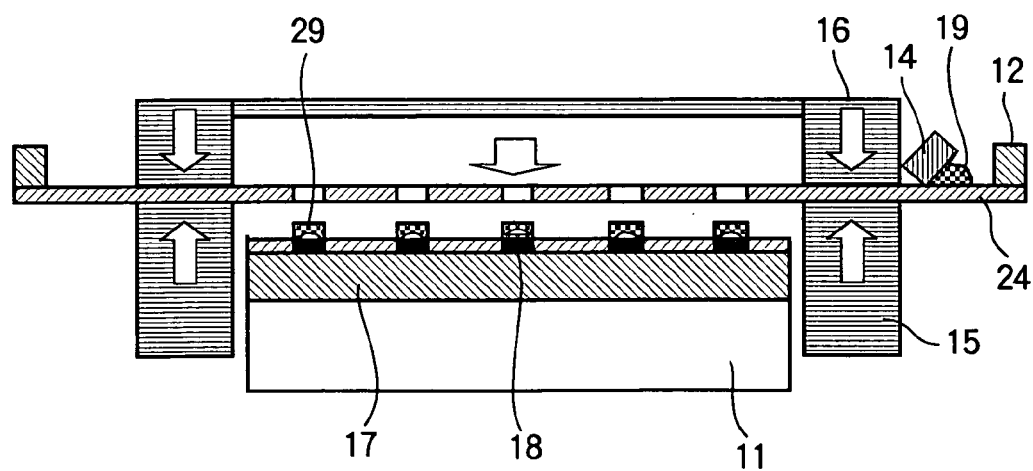

Finally, the upper member 16 is lowered, pneumatic pressure is applied, and the stage 11 is lowered to separate the wafer 17 from the stencil 24 as shown in FIG. 9. The processes in FIGS. 8 and 9 are similar to the processes in FIGS. 3 and 4 in the first embodiment, so detailed descriptions will be omitted.

In the second embodiment, because the first printed layer of conductive ink 28 is comparatively thin, it separates easily from the (thin) stencil 23, and gas produced by reduction reactions on the surfaces of the contact terminals during the reflow process is readily discharged to the outside, avoiding the generation of voids in the first layer of printed conductive ink 28. When the wafer 17 and stencil 24 are separated after the printing of the second layer of conductive ink 29, compressed air is supplied as in the first embodiment, and pneumatic pressure pushes the second layer of printed conductive ink 29 out of the second (thick) stencil 24, thereby enabling the conductive ink 29 to separate smoothly despite the thickness of the second stencil 24. The second embodiment enables comparatively thick layers of conductive ink to be printed on the electrode terminals 18 on the wafer 17 with uniform height and secure electrical and mechanical contact. As in the first embodiment, stencil 24 is held taut and the problems of conductive ink residue and missing or malformed bumps are avoided.

Third Embodiment

Figure 10:
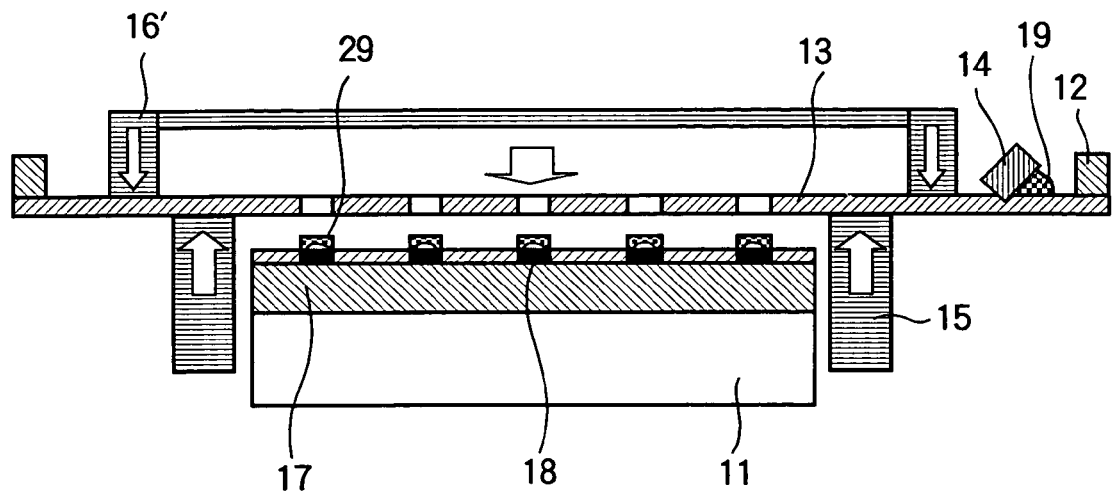
FIG. 10 illustrates a conductive ink printing apparatus according to the present invention.

The third embodiment is a conductive ink printing apparatus, illustrated in FIG. 10. The stage 11, frame 12, stencil 13, squeegee 14, and lower member 15 are as described in the first embodiment, but the upper member 16' has an inner diameter greater than the outer diameter of the lower member 15. The lower member 15 is accordingly closer than the upper member 16' to the edges of the stage 11.

The stage 11, lower member 15, and upper member 16' are not necessarily circular, but regardless of their shape, in the third embodiment the stencil 13 meets the upper member 16' at a locus exterior to the locus at which the stencil 13 meets the lower member 15. That is, in any given direction, the distance from the center of the lower member 15 to the outer surface of its side wall is less than the distance from the center of the upper member 16' to the inner surface of its side wall.

With the lower member 15 is disposed inward of the upper member 16' in this way, when the lower member 15 presses up on the stencil 13 and the upper member 16' presses down on the stencil 13 as indicated by the arrows in FIG. 10, they produce a force acting on the stencil 13 so as to counteract the warping force produced when the wafer 17 separates from the stencil 13. As in the first and second embodiments, the stencil 13 is held taught during the separation process, but in the third embodiment the degree of tautness can be adjusted by adjusting the mechanical pressure applied by the upper and lower members 15, 16' in the direction of the arrows in FIG. 10. For example, the mechanical pressure applied by the upper and lower members 15, 16' in can be adjusted according to the thickness of the stencil 13, to obtain the degree of tautness necessary to assure that the conductive ink 19 leaves the stencil 13 at substantially the same time at all points on the wafer surface, so that a uniform pneumatic pressure is maintained throughout the separation process.

The third embodiment may be used to print conductive ink by either the method of the first embodiment or the method of the second embodiment.

Figure 11:
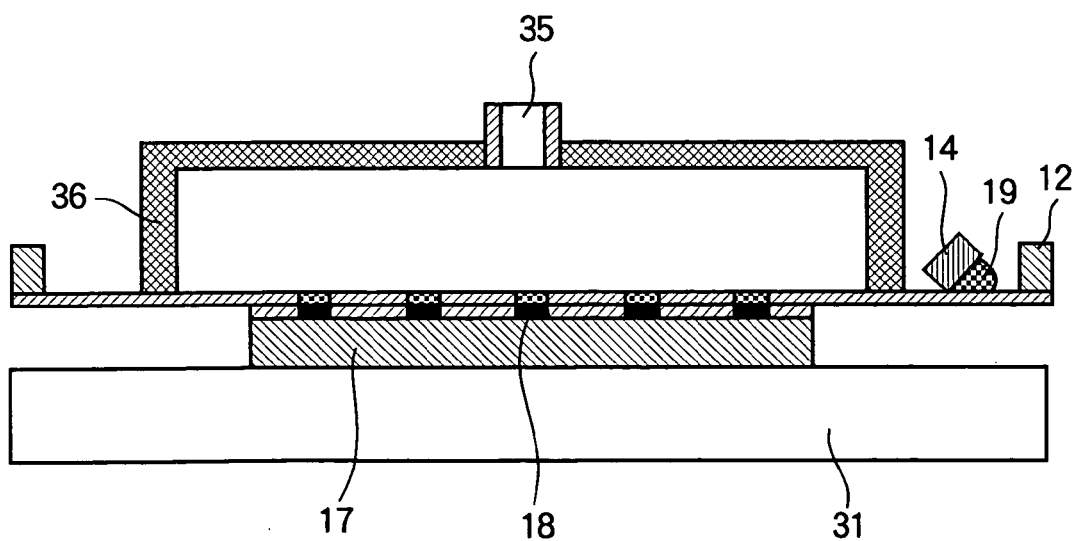
FIG. 11 illustrates a conventional conductive ink printing apparatus.

For comparison with the preceding embodiments, FIG. 11 illustrates a conventional conductive ink printing apparatus. The stage 31 of this apparatus has larger horizontal dimensions than the wafer 17. As the lower member of the present invention is lacking in the conventional apparatus, the upper member 36 does not function to hold the wafer 17 taut; it functions only to create an enclosed space into which compressed air is introduced through a tube 35 after the conductive ink 19 has been applied by the squeegee 14. Differing in particular from the third embodiment, in the conventional apparatus downward movement of the upper member 36 (or upward movement of the frame 12) would only aggravate the tendency of the stencil 13 to warp downward during wafer separation.

In the conventional apparatus in FIG. 11, the stage 31 has the same horizontal dimensions as the stencil 13, an arrangement that does not leave space for a separate lower member supporting the stencil 13. A significant feature of the present invention is that the stage 11 has substantially the same dimensions as the wafer 17 in directions parallel to the stencil 13, which extends beyond the periphery of the stage 11.

In the preceding embodiments, the upper member combined the function of holding the stencil taut with the function of forming a pressurized enclosure, but these functions can be performed by different members. For example, an inner upper member with a closed top may be used to form a pressurized enclosure, and an outer upper member with no top may be used to hold the stencil taut by pressing downward. The outer upper member may be aligned with the lower member as in the first two embodiments, or disposed outward of the lower member as in the third embodiment.

Those skilled in the art will recognize that further variations are possible within the scope of the invention, which is defined in the appended claims.

What is claimed is:

1. A method of printing conductive ink on a wafer, the method comprising:
   supporting the wafer on a vertically movable stage having a periphery;
   supporting a stencil that is held in a frame, on a lower member disposed adjacently surrounding the periphery of the stage;
   raising the stage to bring the wafer and the stencil into mutual contact;
   moving a squeegee to print the conductive ink onto the wafer through the stencil;
   pressing on the stencil with an upper member disposed above the stencil, the upper member being closer than the frame to the stage;
   applying pneumatic pressure to the stencil and the printed conductive ink while the stencil and the wafer are still in mutual contact; and
   lowering the stage to separate the wafer from the stencil while continuing to apply said pneumatic pressure.

2. The conductive ink printing method of claim 1, wherein the upper member includes means for applying the pneumatic pressure.

3. The method of claim 1, wherein the stencil is gripped between the upper member and the lower member.

4. The method of claim 1, wherein the stencil meets the lower member at a first locus and meets the upper member at a second locus exterior to the first locus.

5. The method of claim 1, wherein the stage and the wafer have substantially identical dimensions in directions parallel to the stencil.

6. A method of printing conductive ink on a wafer, the method comprising:
   supporting the wafer on a vertically movable stage having a periphery;
   supporting a first stencil on a lower member disposed adjacently surrounding the periphery of the stage;
   raising the stage to bring the wafer and the first stencil into mutual contact;
   moving a squeegee to print the conductive ink onto the wafer through the first stencil;
   lowering the stage to separate the wafer from the first stencil;
   fixing the printed conductive ink onto the wafer by reflow after the wafer and the first stencil have been mutually separated;
   replacing the first stencil with a second stencil, the second stencil also being supported by the lower member;
   raising the stage to bring the wafer and the second stencil into mutual contact after said reflow;
   moving the squeegee again to print the conductive ink onto the wafer through the second stencil;
   applying pneumatic pressure to the second stencil and the printed conductive ink while the second stencil and the wafer are still in mutual contact; and
   lowering the stage to separate the wafer from the second stencil while continuing to apply said pneumatic pressure.

7. The method of claim 6, wherein the second stencil is thicker than the first stencil.

8. The method of claim 6, wherein the first stencil and the second stencil the identical openings for printing the conductive ink.

9. The method of claim 6, wherein the second stencil is held in a frame, further comprising pressing on the second stencil with an upper member disposed above the second stencil, the upper member being closer than the frame to the stage.

10. The conductive ink printing method of claim 9, wherein the upper member includes means for applying the pneumatic pressure.

11. The method of claim 9, wherein the second stencil is gripped between the upper member and the lower member.

12. The method of claim 9, wherein the second stencil meets the lower member at a first locus and meets the upper member at a second locus exterior to the first locus.

13. The method of claim 6, wherein the stage and the wafer have substantially identical dimensions in directions parallel to the second stencil.

* * * * *